United States Patent
Tsironis (10) Patent No.: US 10,290,428 B1
(45) Date of Patent: May 14, 2019

(54) HIGH POWER LOW FREQUENCY TUNERS

(71) Applicant: Christos Tsironis, Dollard-des-Ormeaux (CA)

(72) Inventor: Christos Tsironis, Kirkland (CA)

(*) Notice: Subject to any disclaimer, the term of this patent is extended or adjusted under 35 U.S.C. 154(b) by 0 days.

(21) Appl. No.: 15/677,086

(22) Filed: Aug. 15, 2017

Related U.S. Application Data (60) Provisional application No. 62/375,941, filed on Aug. 17, 2016.

(51) Int. Cl.
| | | |
|---|---|---|
| *H03H 7/38* | (2006.01) | |
| *H01G 5/013* | (2006.01) | |
| *H01G 5/38* | (2006.01) | |
| *H01G 5/16* | (2006.01) | |
| *H01G 5/011* | (2006.01) | |
| *H01G 5/014* | (2006.01) | |
| *H03H 7/40* | (2006.01) | |

(52) U.S. Cl.
CPC .......... *H01G 5/0132* (2013.01); *H01G 5/011* (2013.01); *H01G 5/014* (2013.01); *H01G 5/16* (2013.01); *H01G 5/38* (2013.01); *H03H 7/40* (2013.01)

(58) Field of Classification Search
CPC .......... H01G 5/0132; H01G 5/38; H03H 7/38; H03H 7/40
USPC .......... 333/32, 17.3, 263; 334/78, 81, 82, 83; 361/298.1, 299.1, 299.5
See application file for complete search history.

(56) References Cited

U.S. PATENT DOCUMENTS

| | | | |
|---|---|---|---|
| 7,646,267 B1 | 1/2010 | Tsironis | |
| 8,912,861 B1 | 12/2014 | Tsironis | |
| 9,344,061 B1 * | 5/2016 | Tsironis | ................ H03H 7/40 |
| 2006/0197624 A1 * | 9/2006 | Jue | ........................ H03H 7/40 |
| | | | 333/32 |

OTHER PUBLICATIONS

"Load Pull System" [online], [Retrieved on Mar. 14, 2017], Retrieved from Internet <URL: http://www.microwaves101.com/encyclopedia/loadpull.cfm>.
"Computer Controlled Microwave Tuner—CCMT," Product Note 41, Focus Microwaves, Jan. 1998.
"Rotary Capacitor" [online], [Retrieved on Aug. 14, 2017], Retrieved from Internet <URL: https://en.wikipedia.org/wiki/Variable_capacitor>.
"Maximum Electric Field, Effects of the breakdown voltage of air" [online], [Retrieved on Aug. 14, 2017]. Retrieved from Internet <URL: http://www.coe.ufrj.br/~acmq/efield.html>.

* cited by examiner

*Primary Examiner* — Stephen E. Jones (57) ABSTRACT

A high power low frequency tuner uses motor controlled rotary capacitors submerged in low loss high epsilon dielectric fluid and lengths of semi-rigid RF cable interconnecting the floating static blocks of the capacitors, the rotating blocks being grounded. And tuner calibration and tuning methods, allowing accurate tuning and perfect Smith chart impedance coverage. The full calibration lasts several hours and is reduced by the "de-embedded" calibration algorithm to minutes. A maximum power embodiment comprises full immersion of capacitors and interconnecting cables in circulated dielectric liquid (mineral oil) for breakdown voltage increase and heat removal.

7 Claims, 12 Drawing Sheets

HIGH POWER LOW FREQUENCY TUNERS

PRIORITY CLAIM

This application claims priority on provisional application 62,375,941, filed on Aug. 17, 2016, titled: "High power low frequency tuners".

CROSS-REFERENCE TO RELATED ARTICLES

1. "Load Pull System" [online], [Retrieved on Mar. 14, 2017], Retrieved from Internet <URL: http://www.microwaves101.com/encyclopedia/loadpull.cfm>.
2. "Computer Controlled Microwave Tuner—CCMT," Product Note 41, Focus Microwaves, January 1998.
3. TSIRONIS, C. U.S. Pat. No. 7,646,267, "Low frequency electro-mechanical impedance tuner"
4. "Rotary Capacitor" [online], [Retrieved on Aug. 14, 2017], Retrieved from Internet <URL: https://en.wikipedia.org/wiki/Variable_capacitor>.
5. "Maximum Electric Field, Effects of the breakdown voltage of air" [online], [Retrieved on Aug. 14, 2017]. Retrieved from Internet <URL: http://www.coe.ufrj.br/~acmq/efield.html>.
6. TSIRONIS, C. U.S. Pat. No. 8,912,861, "Improved Mechanically Controlled Variable Capacitors for Impedance Tuners".

BACKGROUND OF THE INVENTION—PRIOR ART

Figure 1:
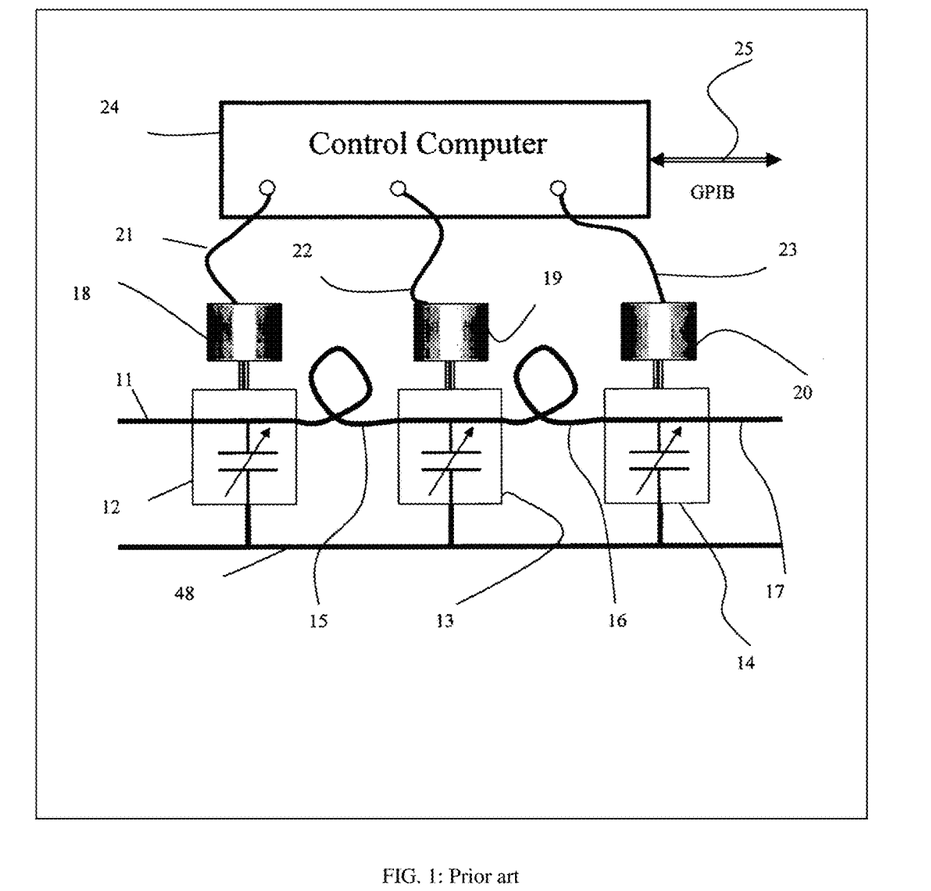
FIG. 1 depicts prior art, the schematics of an impedance tuner using three variable shunt capacitors and lengths of cable connecting them in cascade. Items in this figure are not referred to in this specification.

This invention relates to high power (nonlinear) testing of RF (radio frequency) transistors (DUT) in the frequency and time domain (see ref. 1) using Load Pull. Load pull is the method by which the load impedance presented to the DUT at a given frequency is changed systematically and the DUT performance is registered, with the objective to find an optimum depending on the overall design objectives (see ref. 1). This may be maximum power, efficiency, linearity or else. The same is valid for the source side of the DUT. Passive (slide screw) tuners are used to create the various impedances presented to the DUT (see ref. 2) for frequencies above 100 MHz; these tuners are very long, because the tuning probe must travel along the airline at least one half of a wavelength ($\lambda/2$) to cover 360° of reflection factor area. At 100 MHz this is 1.5 meters, at 10 MHz this is 15 meters. For the manufacturing precision required for this type of machine, this is an extreme read impossible challenge. At lower frequencies the situation is even more critical. For frequencies between 10 MHz and approximately 200 MHz another type of tuner, the "low frequency tuner", is used (see ref. 3). This latter tuner structure uses commercially available variable (rotary blade) capacitors and fixed lengths of coaxial cable (FIG. 1). All items in FIG. 1 are not referred to in this specification.

Figure 2:
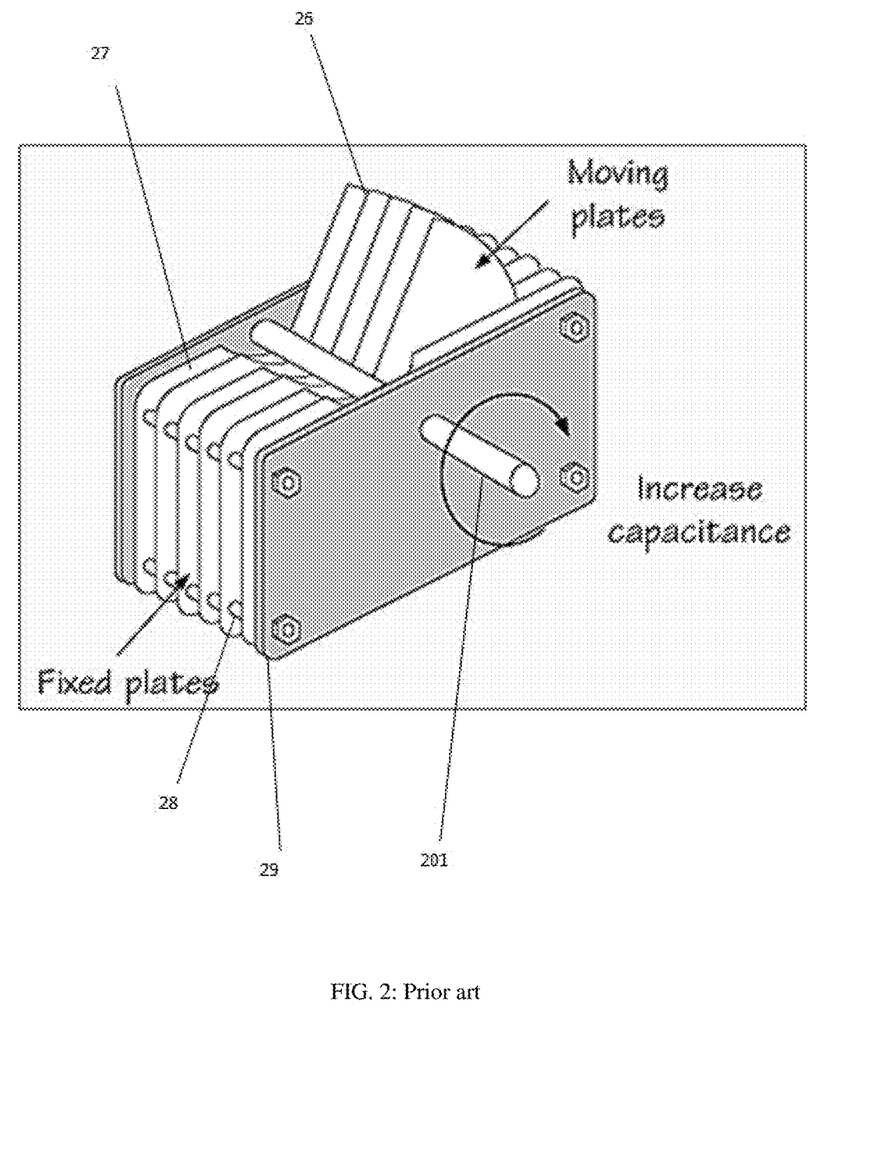
FIG. 2 depicts prior art, the perspective view and basic definitions of the parts of a parallel blade rotary capacitor.
Figure 11A:
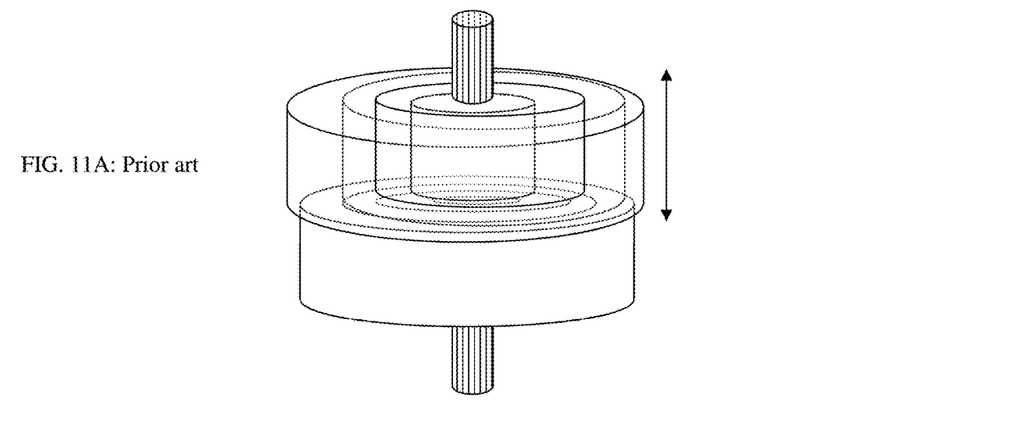
FIG.11A depicts perspective view.
Figure 11B:
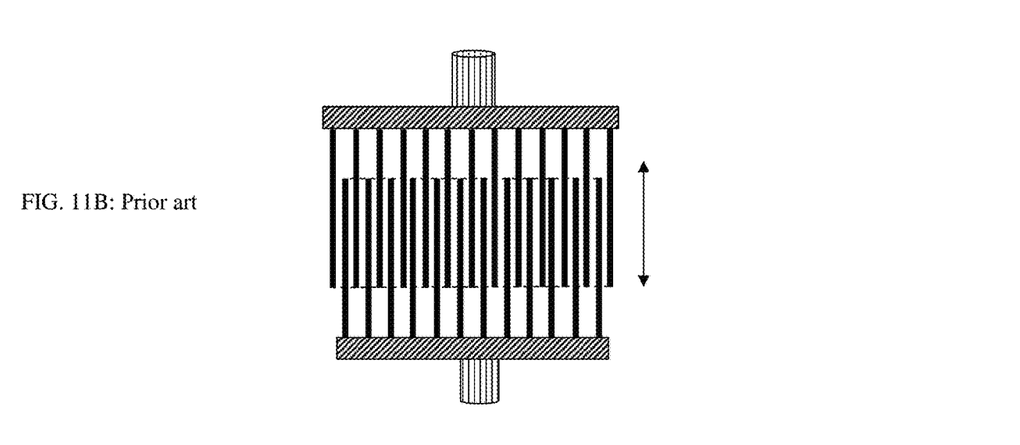
FIG. 11B depicts cross section.

Rotary capacitors (29) (see ref. 4, FIG. 2) are made using sets of parallel metallic blades (26, 27) which are isolated electrically (28) and are inserted into each other inter-digitally by rotating (201) one set (26). Other type of variable capacitors can also be used, such as coaxial type capacitors, appropriate for frequencies at the high end of the frequency specter, whereby concentric tubes are inserted from opposite directions (see FIG. 11).

BRIEF DESCRIPTION OF THE INVENTION

Impedance synthesis is a technique using tuner pre-calibration. The data, measured using a network analyzer, must be saved in computer memory and recalled to be used during the load pull measurement. Also, in order to increase the impedance point density, without unnecessarily increasing calibration time, interpolation methods are used to compute the capacitor's (and eventually the tuner's) behavior, in form of two-port s-parameters (scattering parameters). The power handling of rotary capacitors depends on the distance between the rotating blades and the blades of the stator which move into each-other inter-digitally. The maximum electric field before sparking (Corona) is $E_{max} \approx 3.5$V/$\mu$m=3.5 MV/m (see ref. 5). Using dielectric material between the blades would increase this limit by a factor from 2 to 10, depending on the dielectric constant of the material used, thus increasing the power handling of the tuner. This is done in this invention.

RF transmission has loss. The RF cables used to connect the capacitors, as well as the interconnections and the capacitors themselves are lossy. This creates dissipated power and thus heat. It is therefore part of the solution not only to increase the breakdown voltage between the capacitor blades but also cool down the RF parts that dissipate this power. Therefore mineral oil can also be used for this purpose. In a maximum power embodiment the entire RF section of the tuner is submerged in oil and sealed for leakage. Only the axes (shafts) of the capacitor rotors and the input and output connectors are accessible from outside and properly sealed using hermetic flanges.

This invention discloses a method which allows increasing the breakdown voltage of the rotary capacitors and lowering the temperature of the tuner, and by that increasing power handling into the several kW range.

BRIEF DESCRIPTION OF THE DRAWINGS

The invention and its mode of operation will be better understood from the following detailed description when read when read with the appended drawings in which:

FIG. 11A through 11B depict prior art, high frequency coaxial type variable capacitor.

DETAILED DESCRIPTION OF THE INVENTION

The invention discloses a method for substantially increasing the breakdown voltage of rotary capacitors used in LC based low frequency (5-200 MHz) tuners. The capacitors have a floating static set of blades (31) and a grounded revolving set of blades (30), which are rotated by a shaft (32). Breakdown through air, between the capacitor blades occurs when the electric field reaches the maximum value of approximately 3.5 MV/m. The distance between rotating and static blades is of the order of 0.1 to 0.3 mm. This leads to maximum allowable voltage of approximately 350V, which in a 50Ω system corresponds to a theoretical maximum of $Pmax=Vmax^2/50\Omega \approx 2.45$ kW. In praxis, of course, edge phenomena at the end of the overlapping blades create "antenna" peak field effects leading to realistic limitations below 1 kW; and, obviously the load is not always 50Ω. In fact low frequency tuners have been tested at power of close to 1 kW without sparking (Corona discharge) but not above and this for relatively short time in order to avoid thermal phenomena because of dissipated power.

Figure 4:
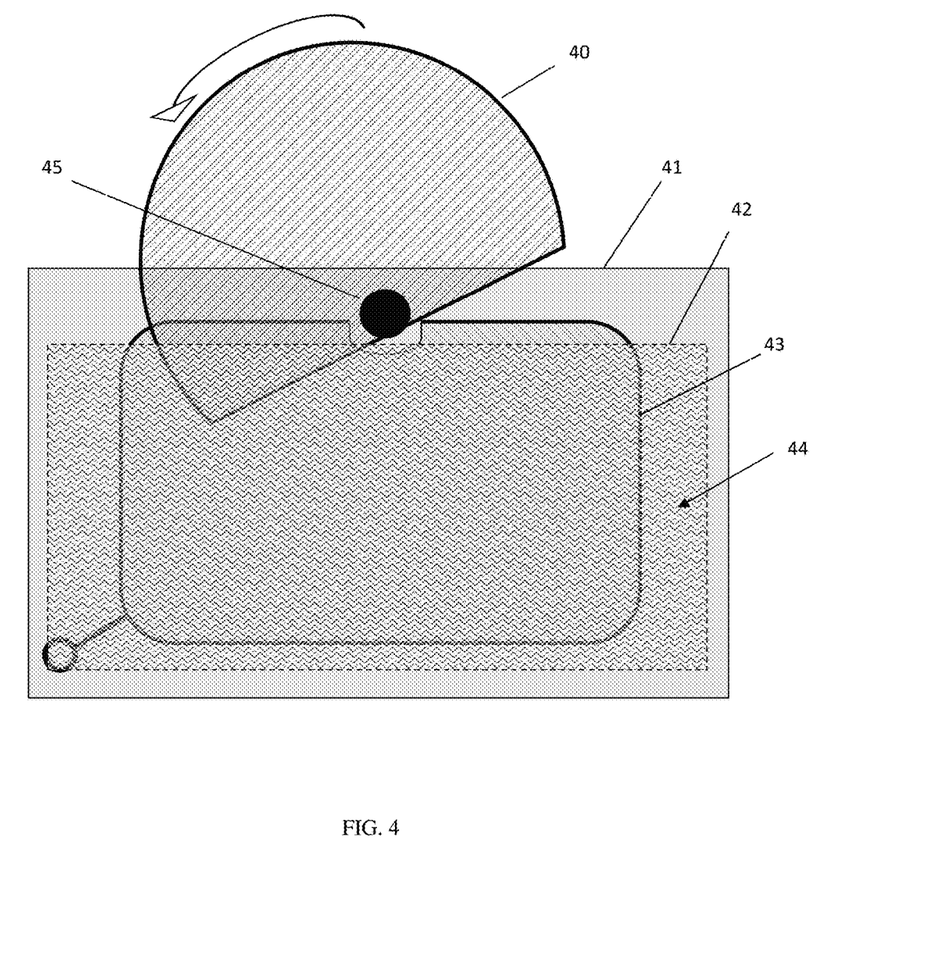
FIG. 4 depicts a view of a rotary capacitor with the rotating blades partially submerged in dielectric fluid.

Introducing a dielectric fluid (for example mineral oil) between the static and rotating blades has a number of effects, most of them positive: (a) It increases the breakdown voltage Vmax by the same factor as the dielectric constant εr of the liquid, and the maximum power at the same time; using mineral oil increases Pmax by a factor of approximately 3 to 5; we expect such tuners to reach maximum power between 5 and 10 kW at 50Ω. (b) It increases the maximum Capacitance value by the same factor εr; this allows using the same capacitors to reach lower frequencies or using capacitors with higher gap between blades, which also leads to higher breakdown voltage; the effects are cumulative. (c) It improves lubrication of the rotating parts, thus increasing lifespan of the parts. (d) It cools the capacitors and also the interconnecting RF cables, if they are also immersed, which are heated by dissipated DC and RF power. On the negative side, (e), if the whole capacitor is submerged in dielectric fluid the residual capacitor Cres will also increase, thus reducing the cutoff resonance frequency, which is created by Cres and the leading inductance Ls of the shaft (45), which carries the rotating blades (40); Cres is created between the shaft (45) and the static blades (43): Fres=1/(2π*sqrt(Ls*Cres)). Therefore in a specific container (41) the level (42) of the dielectric liquid (44) shall not reach the shaft (45) in order to reduce Cres. This embodiment is important for high frequency usage of the tuner, but on the flipside, the maximum voltage between the shaft (45) and the static blades (43) is reduced to the original value of a capacitor without oil. Otherwise, though, the performance of the tuner is not significantly affected.

Figure 3:
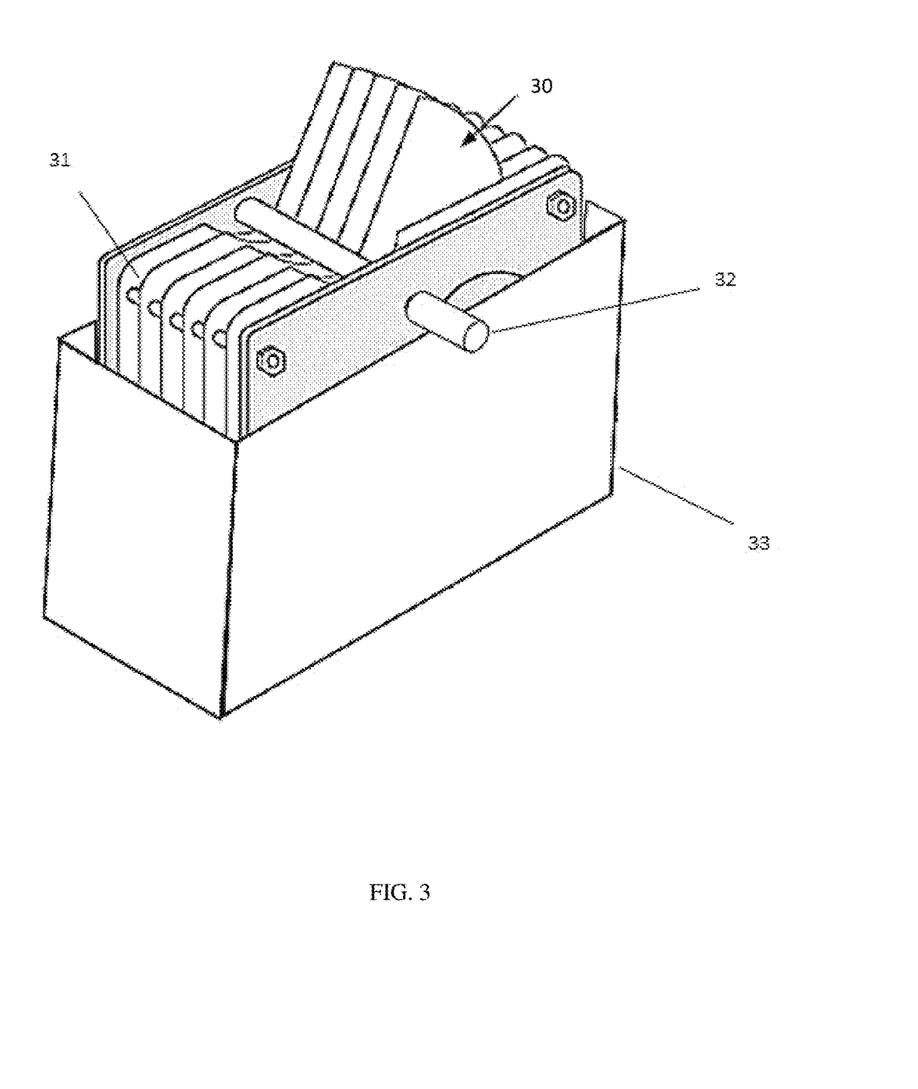
FIG. 3 depicts a rotary capacitor submerged in a container with dielectric fluid (mineral oil).

A view of the rotary capacitor (30, 31, 32) inserted in a container (33) is shown in FIG. 3. As already discussed the present embodiment shows the shaft (32) outside the dielectric liquid (44) (see also FIG. 4). FIG. 4 shows typical position of the rotating blades, creating adjustable capacitance C and the background of the residual capacitance (Cres).

Figure 6:
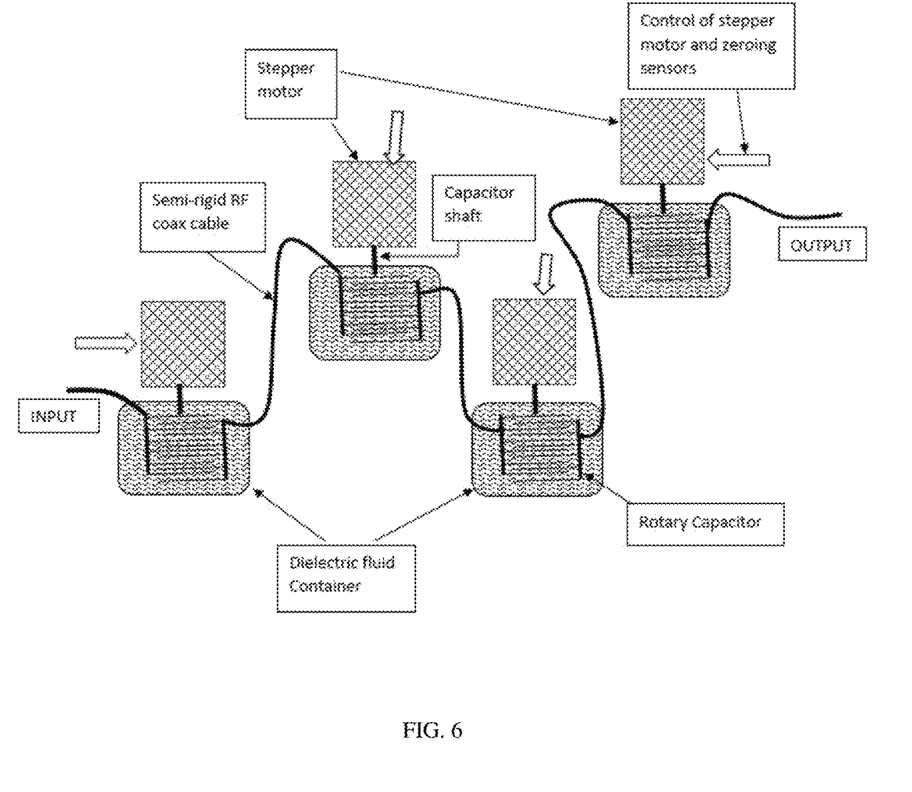
FIG. 6 depicts a breadboard of high power low frequency tuner comprising four capacitors submerged in dielectric fluid.

A breadboard construction of a high power low frequency tuner embodiment is shown in FIG. 6. All elements of the tuner are shown: Semi-rigid coaxial cables between capacitors; stepper motors and control, including zero positioning sensors, to define starting rotation angles for calibration and tuning; the capacitors themselves are shown, as well the dielectric fluid containers. In this configuration the whole capacitors, including the shafts, are submerged in dielectric fluid. In the "minimum Cres" embodiment the capacitors shall be mounted on the side, (FIG. 3) and not vertically as shown in FIG. 6.

Figure 5:
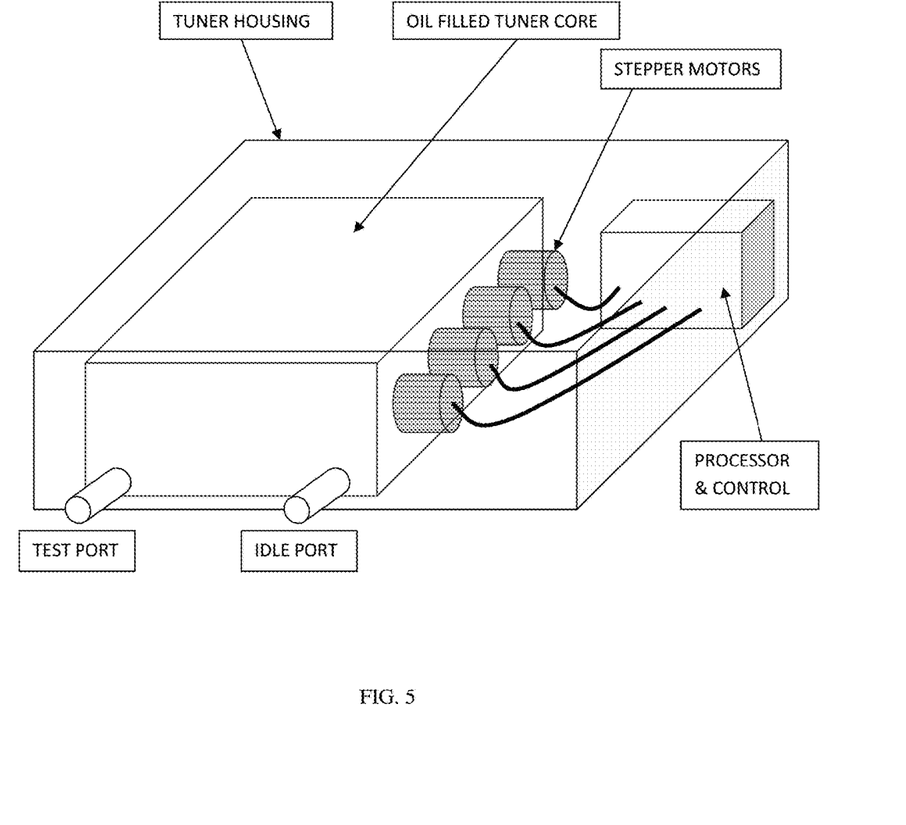
FIG. 5 depicts a high power low frequency tuner with maximized breakdown voltage, control RF shielded and dielectric fluid cooled tuning core.
Figure 10:
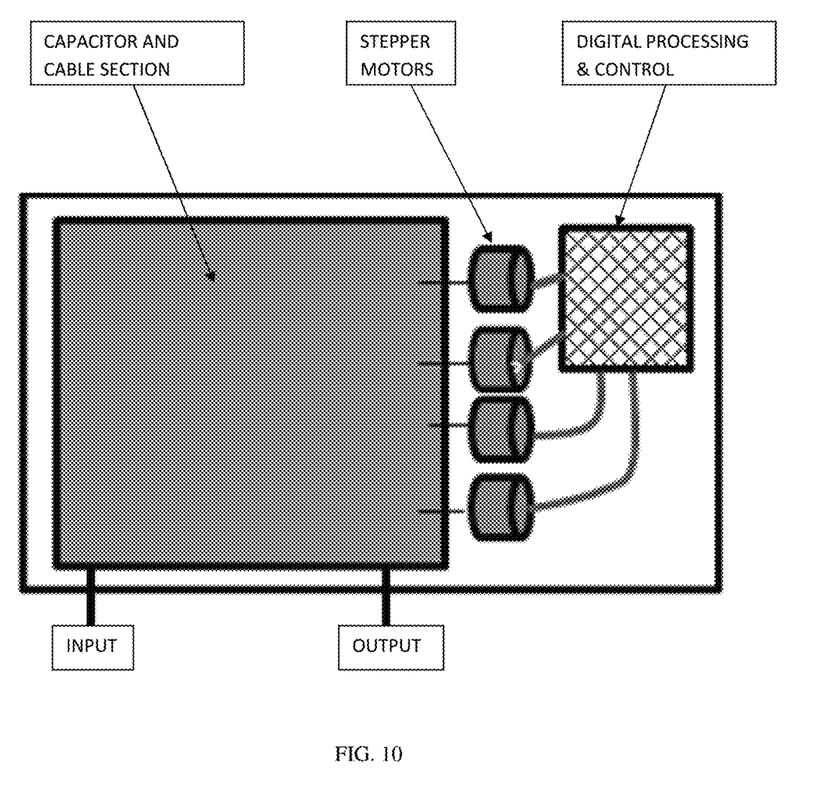
FIG. 10 depicts a maximum power low frequency tuner.

A second embodiment includes a fully immerged tuning section (capacitors and interconnecting RF cables), see FIGS. 5 and 10. In this case the rotor shafts (45) of the capacitors protrude outside a dielectric liquid container using sealing flanges. The shafts (45) are attached to stepper motors, which are controlled by a processor via control electronics. For RF interference and sealing the control electronics are housed in a separate RF shielded container (FIGS. 5 and 10). The other feeds to and from the tuning section are two sealed coaxial connectors (one is the test port, or the input, and the other the idle port, or the output. This second embodiment offers all advantages, especially cooling the RF cables, mentioned above. Optimum operation is, if the liquid is circulated mechanically, using a pump or similar and fed through a radiator if there is available space. The higher residual capacitance can be reduced by using capacitor blades with larger gap, which also increases the breakdown voltage without reducing the capacitance value, because of the dielectric liquid.

Figure 7:
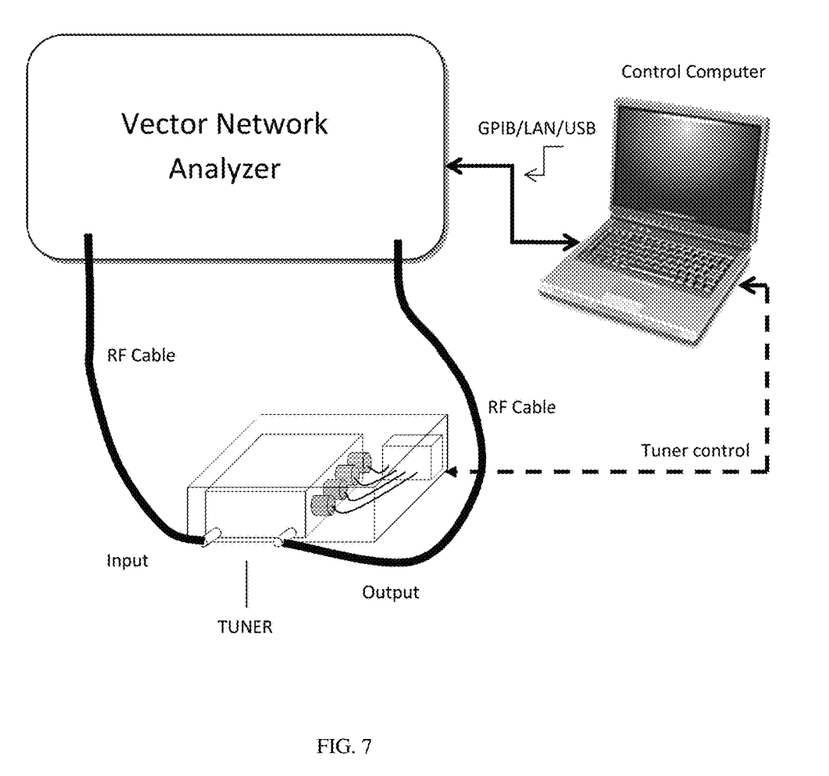
FIG. 7 depicts the tuner calibration setup, comprising the tuner twoport itself, a pre-calibrated vector network analyzer, RF cables and a control computer.

To be used in tuning open-loop operations and load pull measurements the tuners must be pre-calibrated. After calibration it is the repeatability of the tuner states that qualifies the test setup. Typical repeatability of approximately 1% (40 dB) is sufficient. Repeatability R is defined as 10 times the logarithm of absolute square of the vector difference between a calibrated and a "tuned" reflection factor S11: $R=10*\log(|S11.cal-S11.mes|^2)$. Calibration consists of connecting the tuners to pre-calibrated network analyzers using high quality RF cables and measuring the tuner two-port's scattering (s-) parameters for various capacitor settings (FIG. 7). There are two possibilities (a) the direct method and (b) the de-embedding method; in the case of the direct method (a) all permutations of capacitor settings are measured. In the case of 4 capacitors (FIGS. 5 and 10) and 20 settings for each capacitor this corresponds to measuring $20^4$=160,000 points, at 0.5 sec each, i.e. the calibration at one frequency would last approximately 20 hours. In the case of the de-embedded method (b), each capacitor is set individually to 20 positions while all other capacitors are initialized (set to the minimum capacitance). All s-parameter values, except for the s-parameters of the capacitor closest to the test port of the tuner, are multiplied (cascaded) with the inverse initialized matrix of the tuner [S0], which is measured when all capacitors are initialized (set to minimum capacitance). Then all permutations are executed in computer memory. In this case the total time for calibrating one frequency includes 4×20+1 measurement, at 0.5 sec per setting, this makes the operation last less than 60 seconds (or approximately 1 minute) instead of 20 hours. The tuner calibration setup of FIG. 7 comprises the tuner two-port itself, connected using RF cables to a pre-calibrated vector network analyzer (VNA) and a control computer; the control computer sets the tuner states by adjusting the stepper motors and rotating the mobile sets of blades, and measures the tuner two-port s-parameters using the network analyzer, saves temporarily the data, makes all necessary calculations and matrix permutations and corrections and saves the data in calibration files.

Figure 8:
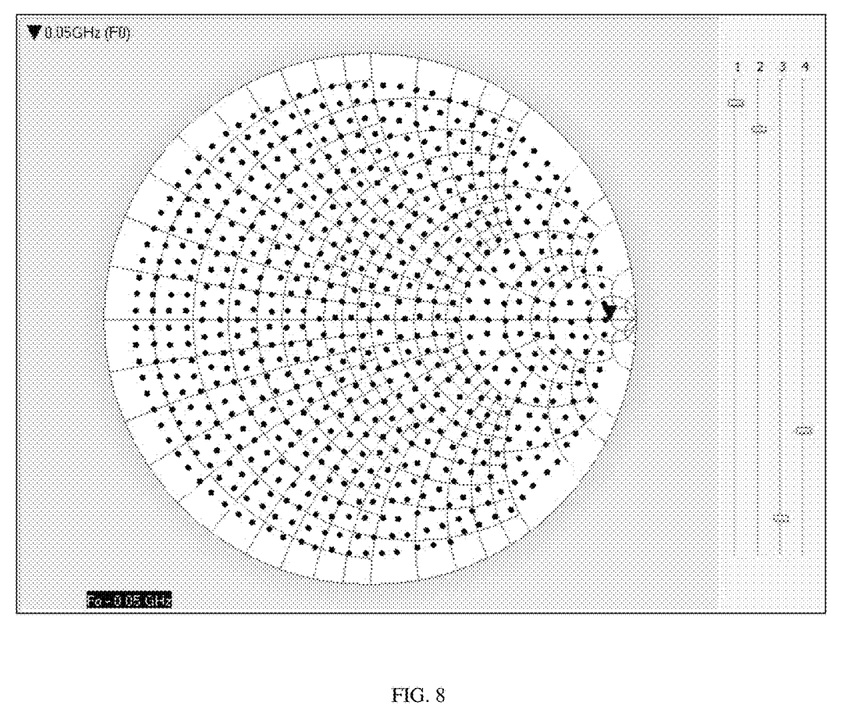
FIG. 8 depicts tuned points covering perfectly the Smith chart, using the breadboard tuner of FIG. 6; frequency=50 MHz.
Figure 9:
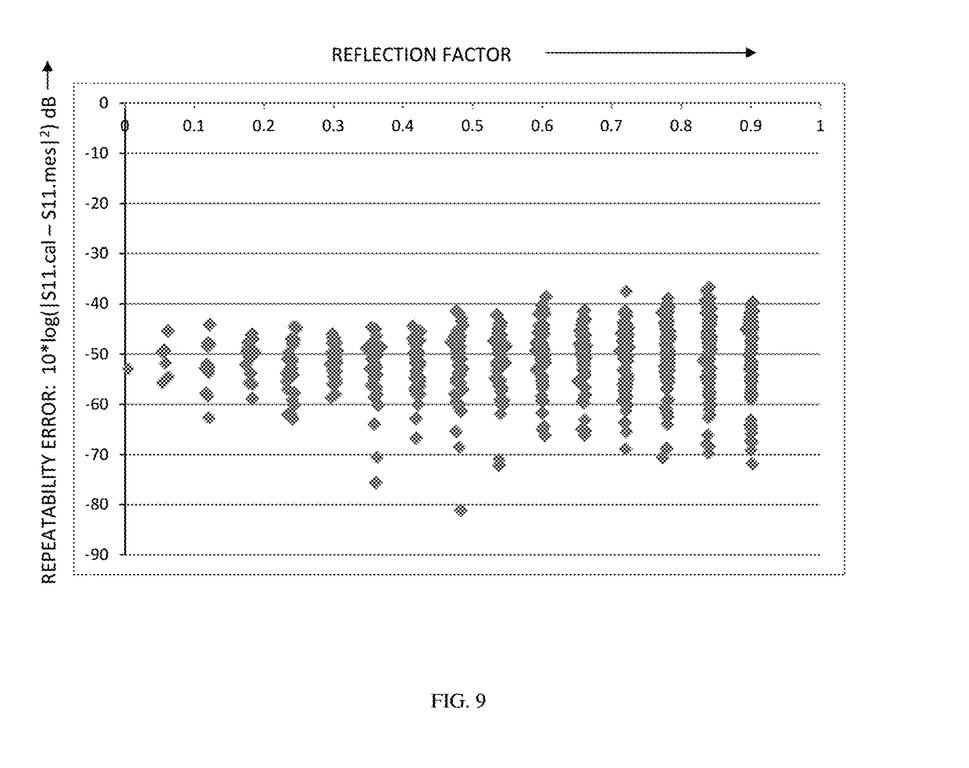
FIG. 9 depicts tuning repeatability results of the high power low frequency tuner.
Figure 12:
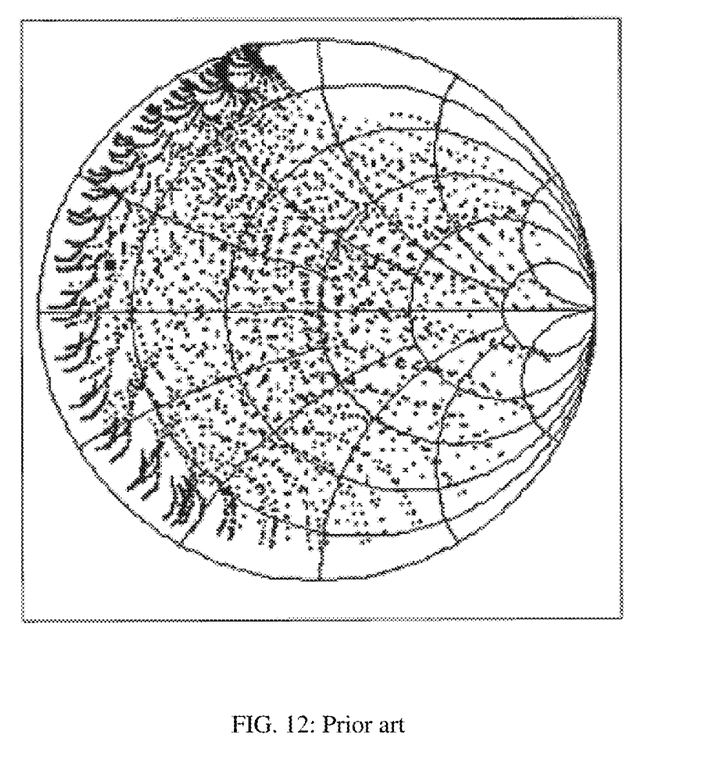
FIG. 12 depicts prior art, distribution of calibration points of capacitor based low frequency tuner.

It is obvious to persons basically versed in LC (inductor-capacitor) RF networks, that a reflection factor (impedance) pattern as shown in FIG. 8 cannot be created by simply moving the capacitors to any of 10 or 20 pre-calibrated positions. If this is done, an irregular pattern as in FIG. 12 occurs. The regular point distribution of FIG. 8 is created by "tuning", i.e. defining a grid of regular S11 points on the Smith chart and "tuning" to those, i.e. calculating the required combination of capacitor states that result in the corresponding S11. These positions are, normally, not calibrated states; therefore the tuning algorithm uses interpolation methods, that allow calculating the s-parameters at capacitor positions between the calibrated states. In the actual situation, the capacitors can be set to 100 discrete positions each (the stepper motors have a step size of 1.8 degrees, or 200 steps per 360 degree revolution, the motor axes are directly connected with the capacitor shafts, and the capacitor blades rotate from minimum to maximum half a circle (see FIG. 4), thus by 100 steps. With 4 capacitors cascaded the possible permutations are $100^4 = 10^8$ or 100 million points. At equal distribution over the Smith chart (surface=$\pi * R^2$, whereby R=1, the surface of each tunable "pixel" is $\pi * 10^{-8} = 0.0000000314$ i.e. allows far higher tuning resolution than the typical 0.001 to 0.005 used in normal testing. The 40 dB repeatability on the other hand corresponds to a Delta S11 vector difference of 0.01, far coarser than the tuner allows. As can be seen from FIG. 9 however, several points are at 50 dB and 60 dB, corresponding to repeatability vector difference of 0.003 or 0.001 (0.3% or 0.1%). Interpolation is straight forward, assuming a first degree differential dependence for small differences since the S11(i), (i=motor steps controlling the capacitor state), behavior is smooth (see ref. 6, FIG. 12); the following relations are used: $X(i)=X(i-1)+\partial X/\partial i * \Delta i$; and $Y(i)=Y(i-1)+\partial Y/\partial i * \Delta i$; whereby "i" is the number of the motor steps rotating the mobile blades of the capacitor, X(i) and Y(i) are the real and imaginary parts of the complex reflection factor $S11(i)=X(i)+jY(i)$, shown on the Smith chart, and $\partial X/\partial i$ and $\partial Y/\partial i$ the gradient of the real and imaginary part of S11 reflection factor as a function of the number of motor steps "i" (see ref. 6, FIGS. 12A and 12B).

The above described simple relations allow an accurate enough description of the RF behavior of the tuner in FIGS. 5 and 10, created between calibrated points, and yield, therefore, reliable and repeatable impedance synthesis (tuning) and load pull operations with tuning resolution higher than the calibrated points alone. The reduced number of calibration points is used in order to allow for a faster calibration procedure and is acceptable as long as (a) the reflection factor behaves smoothly and (b) the interpolation method yields accurate results.

Tuners have loss, both DC and RF loss. The ohmic resistance of the coaxial cables creates DC loss, which, depending on the diameter, length and material of the center conductor of the cable, creates a DC resistance Rdc of a few Ohms. But they also have RF loss, due to radiation, skin effect and more. The RF loss can be easily calculated from the tuner s-parameters: Loss=$(1-|S11|^2)/|S21|^2$. RF Loss in general increases with |S11|; even though in this formula $1-|S11|^2$ decreases when |S11| increases towards 1 (FIGS. 8 and 12), the associated decrease in |S21| (not shown) overcompensates this. Tuner RF loss, as shown in the previous formula, can reach 10 dB, meaning that up to 90% of the RF power injected into the tuner would be either radiated or converted to heat and not reach the output port. Adding to this the DC power dissipated in the tuner residual DC resistance Rdc, Pdc=$Idc^2 * Rdc$ (the transistors are, in general, biased through the tuners, Idc is the transistor DC current) we obtain a total power dissipated of Pdiss=Pin−Pout+Pdc=Pin*(1−1/Loss)+Pdc. Assuming typical values of Rdc=1Ω, Idc=20A, moderate Loss=3 dB (=2 in linear) and injected power Pin=1000 W, we can estimate the power dissipated in the tuner to be Pdiss≈900 W. This heat must be removed before any damage occurs, such as plastic parts of the tuner start melting away. Submerging the cables and the capacitors in dielectric fluid (for instance mineral oil) not only increases the maximum breakdown voltage Vmax, but it also facilitates heat removal. In an alternative embodiment the liquid containers are interconnected with tubes and the liquid is circulated using a pump, adding to it, if necessary, an external cooler (radiator). The containers themselves should not be metallic (see FIG. 7), because, even though metal would absorb heat more easily, there would be parasitic capacitances created, which would increase Cres and decrease Fres.

Obvious alternative including modified components, of the above method are imaginable but shall not impede on the validity and general coverage of the claims of the hereby described concept of improving the RF power and heat handling of rotary capacitors used in LC based low frequency tuners.

What I claim is:

1. A high power low frequency impedance tuner comprising an impermeable tuning unit and a RF shielded control unit, whereby the tuning unit is mounted in a sealed container and has a test (input) coaxial port and an idle (output) coaxial port and comprises at least three grounded variable shunt capacitors and associated lengths of RF cable interconnecting the floating terminals of the capacitors in a cascaded "series L—parallel C" pattern, and whereby the sealed container contains dielectric fluid, whereby only the capacitor rotor shafts protrude from the container and are attached to stepper motors, which are controlled by drivers in the control unit, which is operationally connected to an external controller.

2. The tuner as in claim 1, whereby the dielectric fluid is low loss.

3. The tuner as in claim 1, whereby the dielectric fluid is mineral oil.

4. Calibration method for the tuner as in claim 1, whereby the tuner two-port s-parameters are measured at a given frequency using a pre-calibrated vector network analyzer for a number of settings of each capacitor, between the minimum and maximum capacitance value and for all possible permutations of capacitor settings of all capacitors, and whereby all sets of s-parameters and associated capacitor settings are saved in a tuner calibration file ready for retrieval.

5. Calibration method for the tuner as in claim 1, whereby the tuner two-port s-parameters are measured at a given frequency using a pre-calibrated vector network analyzer as follows:
   a) measure two-port s-parameters for a number of settings of each capacitor "Ci" (i=1, 2, 3 . . . ) individually, between the minimum and maximum capacitance value, all other capacitors being set to their minimum capacitance setting (initialized), and save in file [Si],
   b) measure the s-parameter matrix of the tuner two-port with all capacitors initialized and save in file [S0],
   c) de-embed all s-parameter matrices [Si], for i>1, by cascading with the inverse matrix $[S0]^{-1}$ and save in matrices [Si'],
   d) cascade numerically in computer memory s-parameters of all permutations of all capacitor settings of all matrices [S1] and [Si'] and save in a tuner calibration file ready for retrieval.

6. The tuner as in claim 1, whereby the dielectric fluid is circulated using a pump.

7. The tuner as in claim 6, whereby the dielectric fluid is circulated and fed through a radiator.

* * * * *